United States Patent
Rasal et al.

(10) Patent No.: US 9,115,272 B2
(45) Date of Patent: *Aug. 25, 2015

(54) EDGE SEALANTS HAVING BALANCED PROPERTIES

(75) Inventors: Rahul Rasal, Saint Paul, MN (US); Paul Snowwhite, Dexter, MI (US); Harold Becker, Stelzenberg (DE); Heike Brucher, Rathsweiler (DE); Norbert Schott, Zweibrucken (DE)

(73) Assignee: ADCO Products LLC, Michigan Center, MI (US)

( * ) Notice: Subject to any disclaimer, the term of this patent is extended or adjusted under 35 U.S.C. 154(b) by 490 days.

This patent is subject to a terminal disclaimer.

(21) Appl. No.: 13/501,943

(22) PCT Filed: Oct. 14, 2010

(86) PCT No.: PCT/US2010/052733
§ 371 (c)(1),
(2), (4) Date: Apr. 13, 2012

(87) PCT Pub. No.: WO2011/047194
PCT Pub. Date: Apr. 21, 2011

(65) Prior Publication Data
US 2012/0192947 A1 Aug. 2, 2012

Related U.S. Application Data

(63) Continuation-in-part of application No. 12/679,250, filed as application No. PCT/DE2008/001564 on Sep. 22, 2008, now Pat. No. 8,372,909.

(60) Provisional application No. 61/251,517, filed on Oct. 14, 2009.

(30) Foreign Application Priority Data

Sep. 20, 2007 (DE) .......................... 10 2007 045 104

(51) Int. Cl.
| | |
|---|---|
| C08K 3/04 | (2006.01) |
| C08L 23/02 | (2006.01) |
| C08L 23/18 | (2006.01) |
| C08L 23/22 | (2006.01) |
| C09K 3/10 | (2006.01) |
| H01L 31/048 | (2014.01) |
| F24J 2/46 | (2006.01) |
| C08L 51/06 | (2006.01) |
| C08K 3/00 | (2006.01) |
| C08K 5/00 | (2006.01) |

(52) U.S. Cl.
CPC ................. *C08L 23/02* (2013.01); *C08L 23/18* (2013.01); *C08L 23/22* (2013.01); *C09K 3/10* (2013.01); *F24J 2/465* (2013.01); *H01L 31/048* (2013.01); *C08K 3/0033* (2013.01); *C08K 5/0008* (2013.01); *C08L 51/06* (2013.01); *C09K 2200/0615* (2013.01); *Y02E 10/40* (2013.01); *Y02E 10/50* (2013.01)

(58) Field of Classification Search
CPC ............ C08L 23/02; C08L 23/00; C08K 3/04
USPC .................................. 524/474, 502, 506, 495
See application file for complete search history.

(56) References Cited

U.S. PATENT DOCUMENTS

| | | |
|---|---|---|
| 7,294,665 B1 | 11/2007 | Lim |
| 2002/0010272 A1 | 1/2002 | Mahdi et al. |
| 2003/0162882 A1 | 8/2003 | Grimm et al. |
| 2004/0059069 A1 | 3/2004 | Grimm et al. |
| 2004/0127614 A1 | 7/2004 | Jiang et al. |
| 2007/0062573 A1 | 3/2007 | Ferri et al. |
| 2008/0017296 A1 | 1/2008 | Zhu et al. |
| 2009/0081470 A1 | 3/2009 | Jucker et al. |
| 2011/0003916 A1 | 1/2011 | Becker et al. |
| 2011/0048509 A1 | 3/2011 | Becker et al. |

FOREIGN PATENT DOCUMENTS

| | | | |
|---|---|---|---|
| DE | 19821355 A1 | * | 11/1999 |
| JP | 2006279691 | | 10/1994 |
| JP | 2009295838 A | | 11/1997 |
| JP | 2011217243 | | 8/1999 |
| JP | 2000129133 A | | 5/2000 |
| JP | 2000512333 A | | 9/2000 |
| JP | 200231829 A | | 1/2002 |
| WO | 9961528 | | 12/1999 |
| WO | 2008005214 A1 | | 1/2008 |

OTHER PUBLICATIONS

Translation of DE 19821355 A1, 1982.*
Japanese Patent Office Office Action for Appln. No. 2012-534372, dated Feb. 5, 2014, pp. 1-6.

* cited by examiner

*Primary Examiner* — Wenwen Cai
(74) *Attorney, Agent, or Firm* — Benesch Friedlander Coplan & Aronoff LLP

(57) ABSTRACT

A sealant composition for use in two-pane or multi-pane insulating glass or solar modules, the sealant composition including: a) an olefinic polymer having a number average molecular weight from about 100 D to about 700,000 D, preferably from about 100 D to about 300,000 D; b) a modified olefinic polymer; c) a fine-particle inert filler; d) at least one of a desiccant and a water scavenger, and e) an aging resistor. The sealant composition has a tensile strength greater than 20 PSI, preferably greater than 50 PSI, a lap shear strength greater than 20 PSI, preferable greater than 40 PSI, and the tensile and lap shear strengths balanced such that the sealant fails cohesively before failing adhesively.

54 Claims, 4 Drawing Sheets

EDGE SEALANTS HAVING BALANCED PROPERTIES

CROSS-REFERENCE TO RELATED PATENT APPLICATIONS

This patent application claims the benefit of U.S. Provisional Patent Application No. 61/251,517, filed on Oct. 14, 2009, and is a continuation-in-part of co-pending U.S. patent application Ser. No. 12/679,250, filed on Mar. 19, 2010, which claims the benefit of International Application No. PCT/DE/2008/001564, filed on Sep. 22, 2008, which claims the benefit of German priority document DE/10 2007 045 104.2, filed on Sep. 20, 2007. The contents of the above applications are incorporated herein by reference in their entirety.

FIELD

This invention relates to an edge seal for manufacturing two-pane or multi-pane insulating glass or solar modules, there being provided a sealant having balanced cohesive and adhesive properties to ensure strong adhesive bonding to the glass surfaces and weaker, yet still strong, internal cohesive strength, to prevent delamination of the edge seal from the substrate.

BACKGROUND

The construction of insulating glass units comprising two-pane or multi-pane glass is known. In addition to the glass panes, it is standard practice to use sealants and/or adhesives, spacers and desiccants or water scavengers for this purpose. Solar-module glazing (both photovoltaic solar modules and solar modules for heating water) is assembled in the same way, except that the two glass panes can be replaced partially or completely by sheet metal and/or plastic film.

The spacer consists primarily of metal (usually aluminum), is located in the edge area of the glass panes, and has the function of maintaining the two glass panes at the desired distance apart. A desiccant (e.g. a molecular sieve) is contained additionally within the hollow spacer in order to keep the air or gas trapped between the panes dry. To enable the desiccant to absorb moisture at all, the spacer is provided with small apertures (longitudinal perforation) on the side facing the interpane space. This arrangement prevents moisture from condensing on the inside of the glass panes at low ambient temperatures and impairing the transparency of the insulating glass unit.

Between the sides of the spacer that face the glass panes and the inner surfaces of the glass panes, a seal based on polyisobutylene and/or butyl rubber is provided. This seal is generally known as the primary seal. The function of the primary seal is during production of the insulating glass panes, to be a kind of "assembly aid" while the glass panes are being joined to the spacer, which has been pre-coated with primary sealant, in order to hold the assembly together during the next production stages, and later, during the service life of the insulating glass unit, to form a water-vapor barrier that prevents moisture from penetrating from the exterior inwards into the interpane space, and, if the insulating glass unit is filled with gas, to prevent loss of this gas outwards from the interpane space.

As the outward-facing edge of the spacer is a few millimeters inside of the outside edges of the glass panes, a "channel" is formed into which the secondary sealant, as it is generally known, is injected. The main purpose of the secondary seal is to elastically bond the edge of the insulating glass unit (glass panes and spacer) and also to form a seal—which is to some extent an additional seal—against water and water vapor from the outside and gas from the inside (interpane space). As a rule, the secondary seal consists of room-temperature-curing, two-part sealants and/or adhesives based on polysulfide, polyurethane or silicone. One-part systems, for example based on silicone, or a hot-melt butyl adhesive applied while hot, are also possible.

The systems described above, however, also have certain disadvantages. During production of the insulating glass units, a large number of materials have to be processed in a series of complicated and cost-intensive stages, some of which take place simultaneously.

As far as the thermal insulation properties of the edge seal are concerned, metal spacers used there have the disadvantage of being good heat conductors and thus having a negative influence on an insulating glass pane's desirable low K-value, which, in the case of double- or multi-pane insulating glass, has been improved substantially in recent years by filling the interpane space with inert gas and using glass panes coated with low-emission (low-E) layers.

Particularly as a consequence of the second disadvantage, increasing numbers of insulating glass systems have become available recently which, in place of aluminum as spacer, use: prefabricated stainless steel profiles (lower wall thickness possible and hence reduced heat flow); or prefabricated plastic profiles; or prefabricated thermoplastic profiles; or extrusion compound comprising thermoplastic materials extruded directly onto one of the glass panes. On account of the improved thermal insulation properties in the edge seal, these systems are also known as "warm-edge systems". Examples of the above may be found in EP 517 067 A2, examples and application machinery for in EP 714 964 A1, EP 176 388 A1 and EP 823 531 A2.

The DE 196 24 236 A1 describes a hot-melt adhesive composition for insulating glass, containing a mixture of at least one reactive binder based on silane-functional polyisobutylene, hydrogenated polybutadiene and/or poly-α-olefins, and a non-reactive binder from the group comprising the butyl rubbers, poly-α-olefins, diene polymers, polybutene or styrene block copolymers, which composition may be used as 1- or 2-part adhesive/sealant in the production of insulating glasses. No separate spacers comprising metal or plastic profiles are needed here, and no additional, secondary sealants.

The DE 198 21 355 A1 describes a sealing compound for use in the production of multi-pane insulating glass; the compound contains silane-modified butyl rubber and serves as spacer between the individual panes of the multi-pane insulating glass. Here too, no secondary sealant is needed.

Particularly those spacers extruded directly onto one of the glass panes also overcome the problems relating to the manufacturing process. As a result, insulating glass panes can be made using an automated process which is much more flexible and more productive.

In the field of solar module manufacture, too, applying the spacer directly onto the module edges in this manner has proved to offer many advantages. Compared, for example, with the manual or semi-automatic fitting of pre-extruded butyl tapes, this solution brings not only optical advantages but also productivity advantages; in addition, it makes for a more reliable long-term barrier against water-vapor penetration and gas leakage. The EP 1 615 272 A1 (or DE 10 2004 032 604 A1) contains a description of an exemplary method and device for assembling solar modules.

The thermoplastic material used combines the function of the spacer with that of the primary seal, as it is called. It also contains the desiccant. The TPS system (TPS=thermoplastic spacer) is an example of such a system.

With these systems, too, the outward-facing edge of the spacer is a few millimeters inside of the outer edges of the glass panes, and the remaining space is filled by the secondary seal, as it is called, which bonds the units elastically.

Where silicone is used as the secondary sealant in combination with a thermoplastic spacer such as the TPS system, it has been found that insulating glass units, including those filled with inert gas, can be manufactured substantially more reliably and retain their gastightness in the edge seal even after a large number of weathering cycles (EP 916 801 A2). It is very difficult to obtain equally low gas-leakage rates when using metallic spacers combined with a standard primary seal and a silicone-based secondary seal.

Combined with polysulfide as secondary sealant, the TPS system has, over the past ten years, proved to be completely unproblematic in insulating-glass fenestration applications.

However, particularly in cases where silicone is used as a secondary sealant, there is a disadvantage that can, in certain cases, manifest itself as an optical defect within the insulating glass units. A combination of:
a) materials (e.g. weather seal, EPDM glazing profiles, etc.) which, due to external influences, are not compatible with the insulating-glass edge seal, and
b) construction errors in the glazing area of the insulating glass units, caused by inadequate planning (poor ventilation/drainage of the glass rebate), and
c) extreme exposure (particularly high temperatures at the insulating glass pane and in the edge seal) due to the situation of the installation can cause deformation or movement of the thermoplastic spacer profile into the interpane space. This phenomenon is also known in German as the "Girlanden-Effekt". Depending on the quality of the TPS sealant used, (formulation/production process), there are marked differences in susceptibility to the external influences described under points a) to c). Where silicone is used as secondary sealant, the main reason may be assumed to be the lack of adhesion between the TPS sealant and the secondary seal, and the inadequate adhesion—based only on predominantly physical interactions—of the TPS sealant to the glass. This bond may be easily weakened to a greater or lesser extent by substances migrating into the glass/TPS sealant interface.

Proposals for creating a connection of such kind between the TPS and the silicone secondary seal as to achieve mechanical anchorage or a frictional connection by way of a specially shaped cross-section for the extruded TPS profile (DE 102 04 174 A1) unfortunately cannot be implemented due to the impossibility of obtaining a suitably shaped die for extruding such a profile cross-section. Another problem with this proposal that has not been solved is exactly how to join up the beginning and the end of the spacer profile extruded onto the glass pane. For a normal rectangular cross-section, this has been described and solved in the EP 823 531 A2. A further difficulty with this proposal is encountered while applying the secondary sealant and consists in how to completely fill the partially convex voids within the TPS strand without incorporating any air bubbles. All in all, therefore, this proposal is one that cannot be implemented as such in an everyday production process, and accordingly does not establish the desired objective.

Attempts to achieve chemical adhesion between the TPS sealant and the silicone sealant by selective addition of traditional, silane-based adhesion promoters to one and/or both sealants also fail. To this end, it is desirable to use grades and quantities which unfortunately have a negative influence on other desired properties, for example the working consistency of the TPS sealant, or which later on cause fogging in the insulating glass when the unit has been installed.

SUMMARY

A sealant composition is provided having a) an olefinic polymer, b) a silane modified olefinic polymer, c) a filler, d) a desiccant or a water scavenger, and e) an aging resistor. A tensile strength and a lap shear strength of the sealant composition is balanced such that the sealant fails cohesively before failing adhesively.

In one example of the present invention, the sealant composition has a tensile strength greater than 20 PSI and a lap shear strength greater than 20 PSI.

In another example of the present invention, the sealant composition has a tensile strength greater than 50 PSI and a lap shear strength greater than 40 PSI.

In yet another example of the present invention, the sealant composition chemically reacts with a polar surface containing at least one of alkoxy groups and hydroxyl (—OH) groups such as, but not limited to, glass and poly(vinyl alcohol) (PVA).

In yet another example of the present invention, the sealant composition has an endothermic enthalpy for a peak approximately 100-140 C less than 50 J/g upon four (4) weeks aging under 85% relative humidity 85° C.

In yet another example of the present invention, the sealant composition an endothermic enthalpy for a peak approximately 100-140 C less than 30 J/g, upon four (4) weeks aging under 85% relative humidity 85° C.

In yet another example of the present invention, the sealant composition has a moisture vapor transmission (MVT) less than 0.7 g/m$^2$/day at 38° C. and 100% relative humidity for 0.060 to 0.080 inch thick samples.

In yet another example of the present invention, the sealant composition has a moisture vapor transmission (MVT) less than 0.4 g/m$^2$/day at 38° C. and 100% relative humidity for 0.060 to 0.080 inch thick samples.

In yet another example of the present invention, the sealant composition has a moisture vapor transmission (MVT) less than 15 g/m$^2$/day at 85° C. and 100% relative humidity for 0.060 to 0.080 inch thick samples.

In yet another example of the present invention, the sealant composition has a moisture vapor transmission (MVT) less than 8 g/m$^2$/day at 85° C. and 100% relative humidity for 0.060 to 0.080 inch thick samples.

In yet another example of the present invention, the sealant composition has a melt volume index (MVI) less than 50 cm$^3$/10 minutes at 130° C. and 10 kg load through a 0.0823 inch diameter orifice.

In yet another example of the present invention, the sealant composition exhibits a first viscosity when a first shear force is applied to the sealant composition and a second viscosity when a second shear force is applied to the composition.

In yet another example of the present invention, the first viscosity of the sealant composition is greater than the second viscosity and the first shear force is a less than force than the second shear force.

In yet another example of the present invention, the olefinic polymers are present in the composition in an amount from about 30% to about 60% by weight of the total composition.

In yet another example of the present invention, the olefinic polymers are present in the composition in an amount from about 40% to about 50% by weight of the total composition.

In yet another example of the present invention, the silane modified olefinic polymer is present in the composition in an amount from about 2% to about 35% by weight of the total composition.

In yet another example of the present invention, the silane modified olefinic polymer is present in the composition in an amount from about 5% to about 25% by weight of the total composition.

In yet another example of the present invention, the filler is present in the composition in an amount from about 5% to about 40% by weight of the total composition.

In yet another example of the present invention, the filler is present in the composition in an amount from about 10% to about 30% by weight of the total composition.

In yet another example of the present invention, the desiccant or water scavenger is present in the composition in an amount from about 2.5% to about 25% by weight of the total composition.

In yet another example of the present invention, the desiccant or water scavenger is present in the composition in an amount from about 10% to about 15% by weight of the total composition.

In yet another example of the present invention, the aging resistor is present in the composition in an amount from about 0% to about 3% by weight of the total composition.

Further features and advantages of the present invention will become apparent by reference to the following description and appended drawings wherein like reference numbers refer to the same component, element or feature.

DRAWINGS

The drawings described herein are for illustration purposes only and are not intended to limit the scope of the present disclosure in any way.

DETAILED DESCRIPTION

Figure 1:
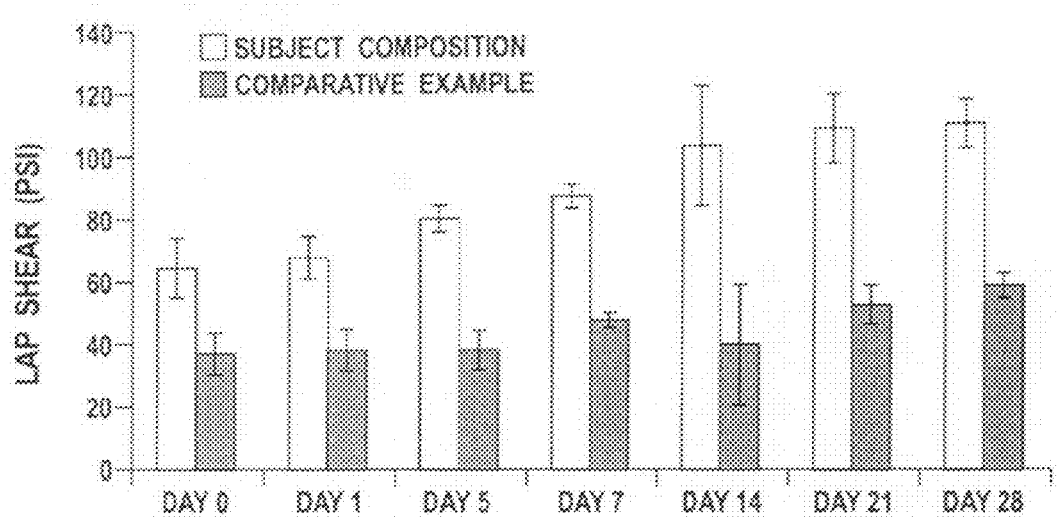
FIG. 1 is a bar chart depicting the lap shear strength of an example of the sealant composition and the comparative example.

The invention is explained in detail below by reference to an embodiment and a comparative example.

Example 1

Comparative (Prior Art)

| Material | Wt % |
|---|---|
| Polyisobutylene MW 60,000 | 50 |
| Calcium Carbonate (CaCO$_3$) | 14 |
| Carbon Black | 20 |
| Molecular Sieve A3-Type | 15 |
| Phenolic Antioxidant | 1 |

Example 2

| Material | Wt % |
|---|---|
| Polyisobutylene | 42 |
| Silane modified APAO or PIB | 12 |
| Calcium Carbonate (CaCO$_3$) | 10 |
| Specialty Carbon Black | 20 |
| Molecular Sieve A3-Type | 15 |
| Phenolic Antioxidant | 1 |

The effect of the sealing compound of this invention compared to the prior art becomes evident from the following comparative test:

To one long edge in each case of test insulating-glass panes measuring 500×350 mm and constructed as 4 mm float glass/16 mm interpane space/4 mm float glass plus the edge seal consisting in the one instance of:
1) the sealing compound of the comparative example 1 as thermoplastic spacer and a conventional 2-part silicone as secondary sealant, and in the other instance of
2) the sealing compound according to example 2 of the invention as thermoplastic spacer and the same conventional 2-part silicone as in 1) as secondary sealant, an EPDM profile of the kind typically employed for glazing applications and having a plasticizer content of about 20% mineral oil is bonded using a one-part silicone sealant with a high silicone-plasticizer content, said profile thus being brought into direct contact with the edge-seal sealants. The test panes prepared in this way were then exposed to a weathering-cycle test (−20° C./+80° C. at 95-100% rel. humidity, 8 hours per cycle, 3 cycles per day).

After only about 4-5 weeks of the weathering-cycle test, test pane 1) showed deformation, i.e. movement, of the thermoplastic spacer profile into the interpane space. This was caused by the incompatibility reactions (plasticizer migration from the EPDM profile and the one-part silicone sealant).

Test pane 2), by contrast, showed no impairment of the edge seal whatsoever even after more than 50 weeks of the weathering-cycle test.

Similarly, the glass adhesion and the edge seal showed no recognizable impairment whatsoever after more than 4,000 hours of irradiation with UV lamps (Ultra-violet) and temperatures at the pane surfaces of up to 110° C.

An edge seal that can withstand stresses of this kind is thus suitable not only for insulating-glass applications in particularly demanding situations, e.g. frameless glazing in facades or roofs (known as structural glazing), but also, for example, for the edge seal in solar modules.

In addition to the first application of a strand of reactive butyl compound, it is also possible to apply a second strand of butyl before the solar module is pressed. This is a particularly useful solution in cases where the electrical contacts of the photovoltaic cells contained in the module are made to pass through the edge seal to the outside. After the first strand has been applied, the contacts—usually in the form of thin tape—are channeled to the exterior and the second butyl strand is then extruded directly on top of the first one. The contacts are thereby embedded in the butyl compound, thus ensuring that in the finished solar module, the contact leads across the edge seal to the outside are gastight and impermeable to water vapor. Since the contacts are usually in the form of non-insulated metal tapes, the edge seal must not show any electrical conductivity, as this can cause fault current or short circuits between the contacts. In the case of a silicone-based secondary seal, this is no problem, since silicones typically show very high volume resistivities, mostly $>10^{14}$ Ohm·cm, and thus fall within the category of electrical insulators. However, butyl sealants with a high filler content of carbon black—as in the case of the reactive butyl compound described here—have volume resistivities of $<10^6$ Ohm·cm, meaning that the compound would be electrically conductive. Reducing the carbon black content admittedly increases the volume resistivity, but also brings many disadvantages. Aside from mechanical reinforcement and viscosity regulation, the purpose of a high carbon black content in a butyl sealant is to make the mixture particularly stable toward high temperatures and UV irradiation. If the carbon black content were to be substantially reduced because of the volume resistivity, this would no longer be the case and the butyl sealing compound would no longer show the required long-term stability for applications in the field of solar modules, i.e. for applications involving high temperatures and solar radiation. By using a specialty carbon black in place of the carbon blacks generally used in butyl sealants, however, it is possible to obtain a reactive butyl compound that has all the required properties. It transpired that by selecting an oxidatively post-treated carbon black made by the furnace process and having a primary-particle size in the 50-60 nm range, a carbon black had been found which not only permitted filler contents of up to 20 wt. % for the reactive butyl compound, which are necessary for stabilization, mechanical reinforcement and viscosity regulation, but simultaneously result in a volume resistivity of $>10^{10}$ Ohm·cm, which is fully adequate for the electrical insulating effect required of the reactive butyl sealing compound.

A specialty carbon black of this kind is used in the following example.

Example 3

| Material | Wt % |
| --- | --- |
| Polyisobutylene | 40 |
| Silane modified APAO or PIB | 10 |
| Calcium Carbonate (CaCO$_3$) | 20 |
| Specialty Carbon Black | 17 |
| Molecular Sieve A3-Type | 12 |
| Phenolic Antioxidant | 1 |

The sealing compound is a hot-melt sealant that contains Vestoplast 206, a silane grafted amorphous poly alpha olefin (APAO), that chemically reacts with glass hydroxyl (—OH) groups or alkoxy groups in the presence of water resulting in the formation of a covalent bond. The inability of silanes to chemically bond with glass may result in delamination. This sealant-glass chemical bonding is very important with respect to the long-term solar module water resistance, as one of the common failure modes is the water ingress into the module through the passage (opening) near glass-sealant interface.

A comparative example, commercially available from a manufacturer of edge sealants was used to compare the performance of the sealant composition. The progression of sealant-glass reaction was quantified using 180° lap shear analyses. 1"×1", 1.7 mm samples were sandwiched in between two glass plates (1"×3"). This sandwich was conditioned at 240° F. for ~30 min and compressed to 1.22 mm final thickness. These lap shear samples were aged for a month in 85° C.-85% relative humidity (damp heat) chamber to monitor lap shear values and failure modes. The reported lap shear is an average of at least 3 specimens pulled at 4 inch/min (the peak value is reported as the lap shear). Heat as well as damp heat aged samples (approximately 3-5 mg) were characterized using differential scanning calorimetry (standard mode, TA instruments) to monitor the presence of free water in samples and crystallization behavior. Samples were equilibrated at −90° C. and ramped to 200° C. at 10° C./min.

FIG. 1 shows the lap shears for the sealant composition of the present invention and the comparative example as a function of 85° C.-85% relative humidity aging time. It was observed that the sealant composition lap shears were always higher than the comparative example during one month aging study. This indicated that the sealant composition adhesion bond to glass was much stronger than that of the comparative example. Furthermore, while the comparative example exhibited adhesive or partially adhesive failures the sealant composition always failed cohesively indicating a better balance of cohesive and adhesive properties.

Figure 2:
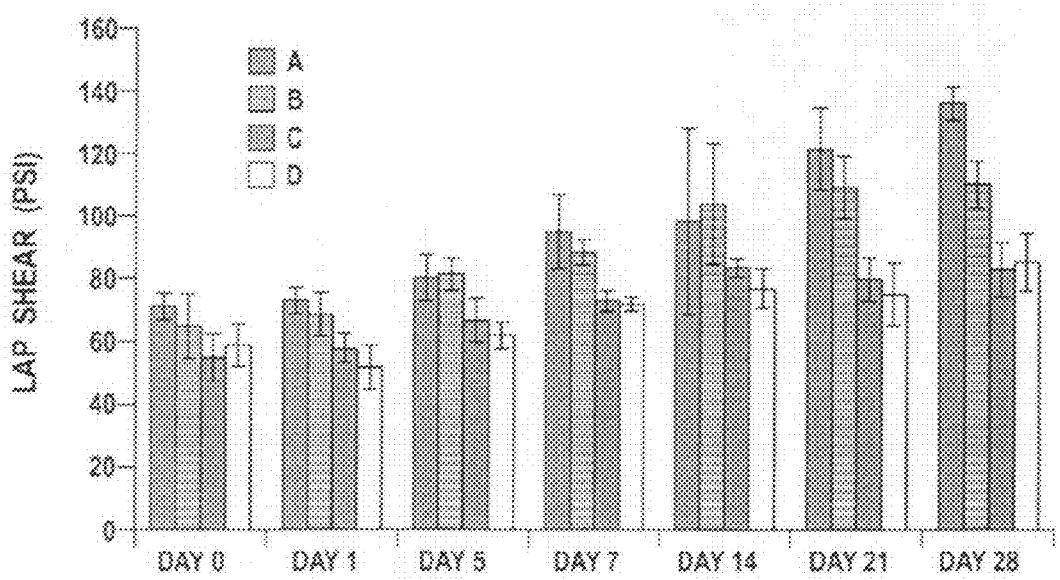
FIG. 2 is a bar chart depicting the lap shear strength of an example of the sealant composition having variable silane content.

FIG. 2 shows the lap shear values for the sealant composition with different silane contents as a function of 85° C.-85% relative humidity aging time. Initially (roughly up to day 5) there was not any significant difference in lap shears (adhesion to glass) for the sealant composition, the sealant composition with no silanes, the sealant composition with non reactive silanes, and the sealant composition with twice as much silanes. However, as these samples aged in damp heat chamber, it was observed that the sealant composition and the sealant composition with twice as much silane had significantly higher lap shear strengths (adhesion to glass) than the sealant composition without silanes and the sealant composition with non reactive silanes. This ladder study confirmed that the presence of silanes led to the increase in adhesion to glass with time via sealant (silanes) glass surface chemical bonding.

Figure 3:
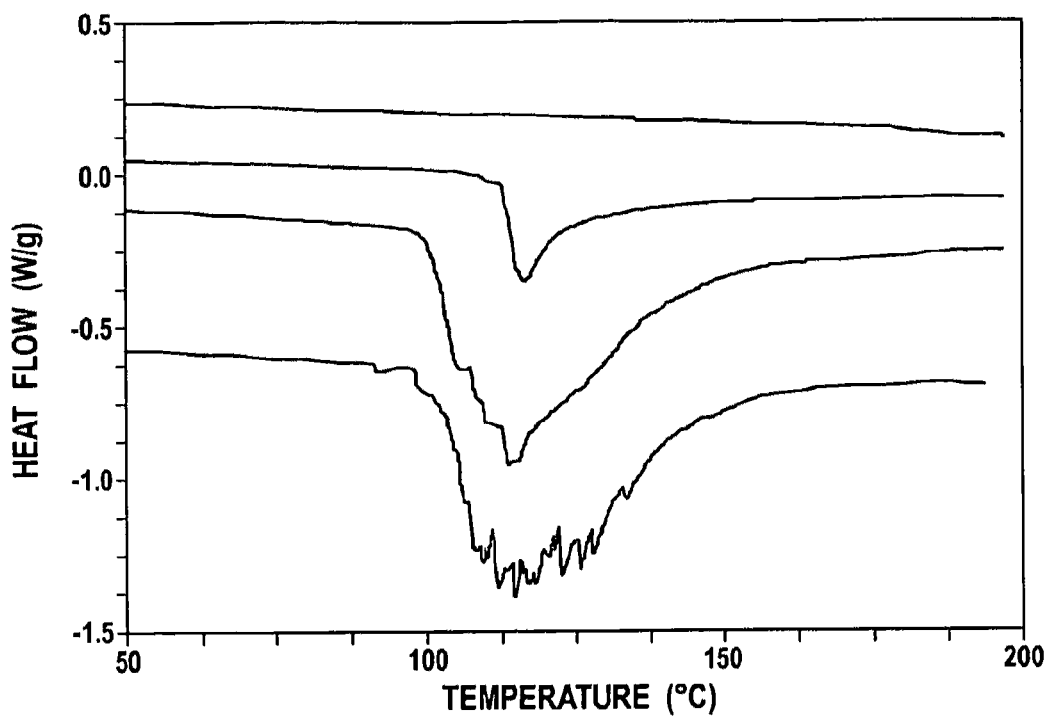
FIG. 3 is a graph illustrating DSC scans for the comparative example as a function of damp heat aging time.
Figure 4:
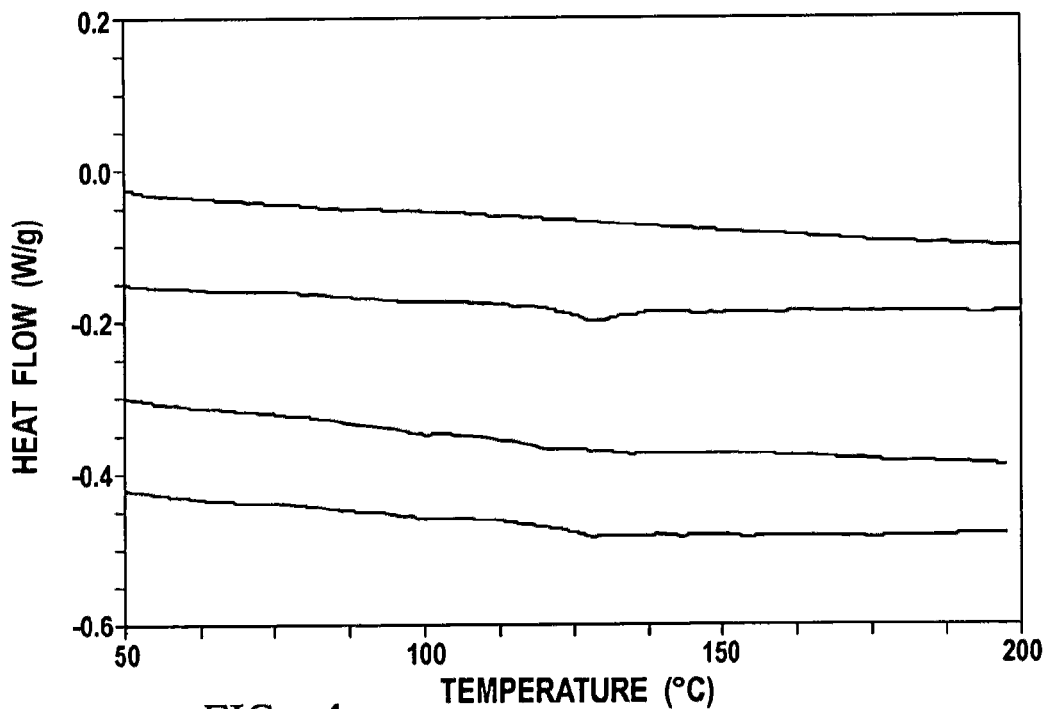
FIG. 4 is a graph illustrating DSC scans for an example of the sealant composition as a function of damp heat aging time.

FIG. 3 shows the sample DSC scans for the comparative example as a function of damp heat aging time. Day 1 aged samples showed an endothermic melting peak (onset around 100° C.). This melting peak observed to expand upon aging (FIG. 3) indicating the crystallinity build up. This peak corresponds to the polyethylene (low density and/or linear low density), which is more likely the carrier of the comparative example silanes. Once these silanes crystallize, they cannot diffuse towards glass and react to build up the chemical adhesion to glass. Thermal analyses of the sealant composition silanes did not reveal any significant crystallization upon aging (see FIG. 4). This non-crystallization tendency was more likely the reason behind higher the sealant composition lap shears (adhesion to glass).

Crystallization often involves the orientation of polymer chains resulting in the oriented structures (crystals) (see FIG.

5). Once these crystals are formed, the polymer chains get locked and are not mobile. A chemical reaction involves the diffusion of reactive species toward each other followed by orientation and then reaction. In case of solar edge sealant applications, glass is the stationary surface. Hence the sealant (silane)-glass reaction proceeds only through the diffusion of reactive silanes towards the glass surface. However, upon crystallization, these silanes are locked in place, cannot diffuse (unless melted or dissolved), and hence cannot migrate to the surface to react with glass.

The sealant composition and the comparative example were also tested for cohesive and adhesive properties. The moisture-cure-potential of the sealant composition makes it suitable to covalently react with glass. The progression of this reaction was quantified using 180° lap shear analyses. One inch by one inch, 1.7 mm thick samples were sandwiched in between two glass plates (1×3"). This sandwich was conditioned at 240° F. for ~30 min and compressed to 1.22 mm final thickness. Tensile samples were dog-bone shaped, the gauge dimensions being 1.5 inch×8 mm. These lap shear and tensile samples were aged for a month in 85° C.-85% relative humidity chamber to monitor lap shear values. The reported lap shear is an average of at least 3 specimens pulled at 4 inch/min (the peak value is reported as the lap shear) tested at room temperature.

Heat as well as damp heat aged samples (approximately 3-5 mg) were characterized using differential scanning calorimetry (standard mode, TA Instruments Q200 DSC) to monitor the presence of free water in samples and crystallization behavior. Samples were equilibrated at −90° C. and ramped to 200° C. at 10° C./min.

Melt flow index values were collected at 130° C. for the sealant composition and the comparative example samples. A 0.823 mm diameter cylindrical column was preheated to 130° C. followed by inserting the sample to be tested into this column. A 0.1 kg piston attached to 9.9 kg weight (total 10 kg weight) was inserted at the top end and the material exiting the bottom end was collected.

Mocon moisture vapor permeability equipment (Permatarn-w 3/33) was used to monitor the water transmission through the samples (5 cm diameter and 1.5 mm thick circular samples).

Figure 5:
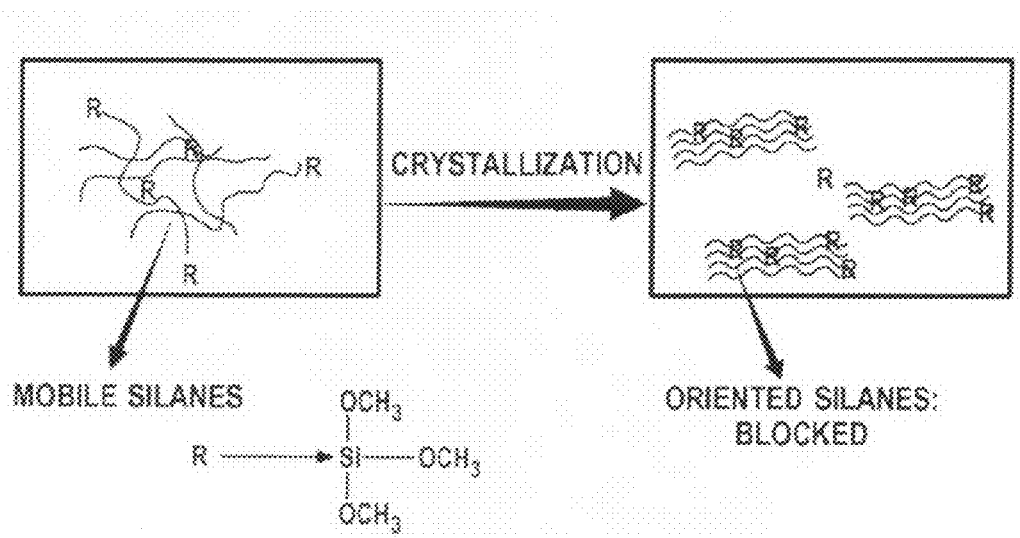
FIG. 5 is a illustration depicting crystallized and uncrystallized polymer chains.

FIG. 5 shows the lap shears for the sealant composition and the comparative example as a function of 85° C.-85% relative humidity aging time. It was observed that the sealant composition lap shears were always higher than comparative example during one month aging study. This indicated that the sealant composition adhesion bond to glass was much stronger than that of comparative example.

Figure 6:
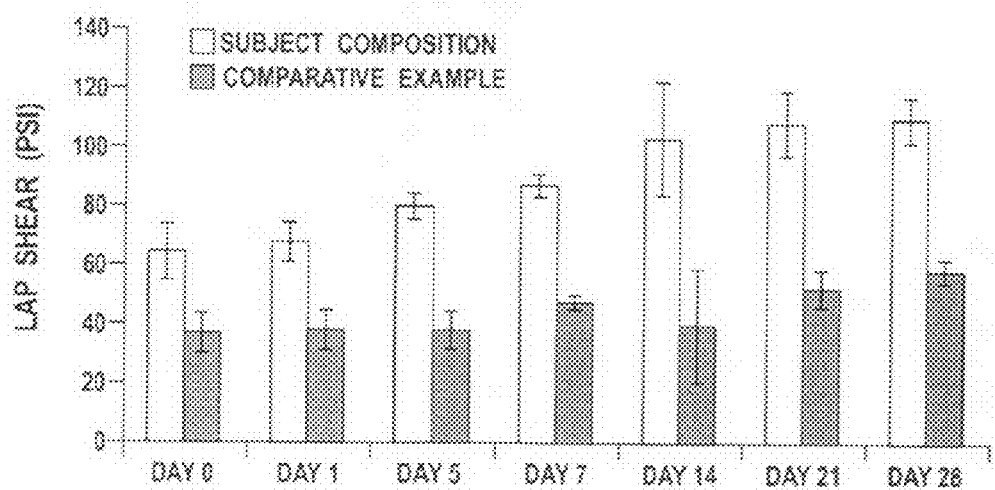
FIG. 6 is a bar chart depicting the lap shear strength of an example of the sealant composition and the comparative example.

FIG. 6 shows the lap shear values for the sealant composition with different silane contents as a function of 85° C.-85% relative humidity aging time. Initially (roughly up to day 5) there was not any significant difference in lap shears (adhesion to glass) for the sealant composition, the sealant composition with no silanes, the sealant composition with non reactive silanes, and a sealant composition with twice the silane content. However, as these samples aged in damp heat chamber, it was observed that the sealant composition and the sealant composition with twice the silane content had significantly higher lap shear strengths (adhesion to glass) than the sealant composition without silanes and the sealant composition with non reactive silanes. This ladder study proved that the presence of reactive silanes led to the increase in adhesion to glass with time. Although, the sealant composition and the sealant composition with twice the silane content showed insignificant differences in lap shear strengths, it should be noted that this study was conducted for only one month, and upon monitoring the progression further, a differentiation may be seen.

Lap shear values for the subject sealant composition with different silane contents as a function of 85° C.-85% relative humidity aging time; A: subject composition with twice the silane content, B: subject composition, C: subject composition with non-reactive silanes, and D: subject composition with no silanes.

Figure 7:
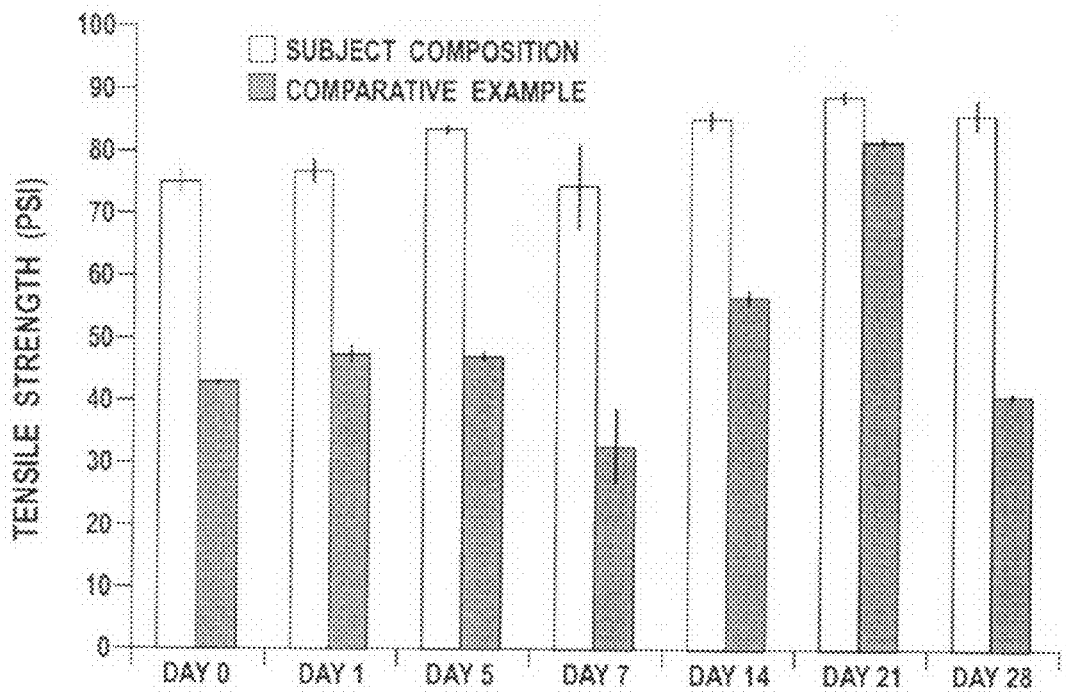
FIG. 7 is a bar chart depicting the tensile strength of an example of the sealant composition having variable silane content.

FIG. 7 shows the tensile strengths for the sealant composition with different silane contents as a function of 85° C.-85% relative humidity aging time. Tensile strength is the representation of the cohesive strength within the sealant. It was clearly seen that the tensile strength (cohesive strength) of the subject sealant composition was higher than that of the comparative example.

The melt flow index for the subject sealant composition was 25±5 g/10 min at 130° C.; while that for the comparative example was 0 (the material did not go through the column). This indicated that the subject sealant composition flows much better during processing (pumping) at normal processing temperatures.

The subject sealant composition showed low moisture vapor transmission (MVT) of 4.5 g/m² day at 85° C./100% relative humidity, compared to the comparative example MVT of 11.57 g/m² day.

Figure 8:
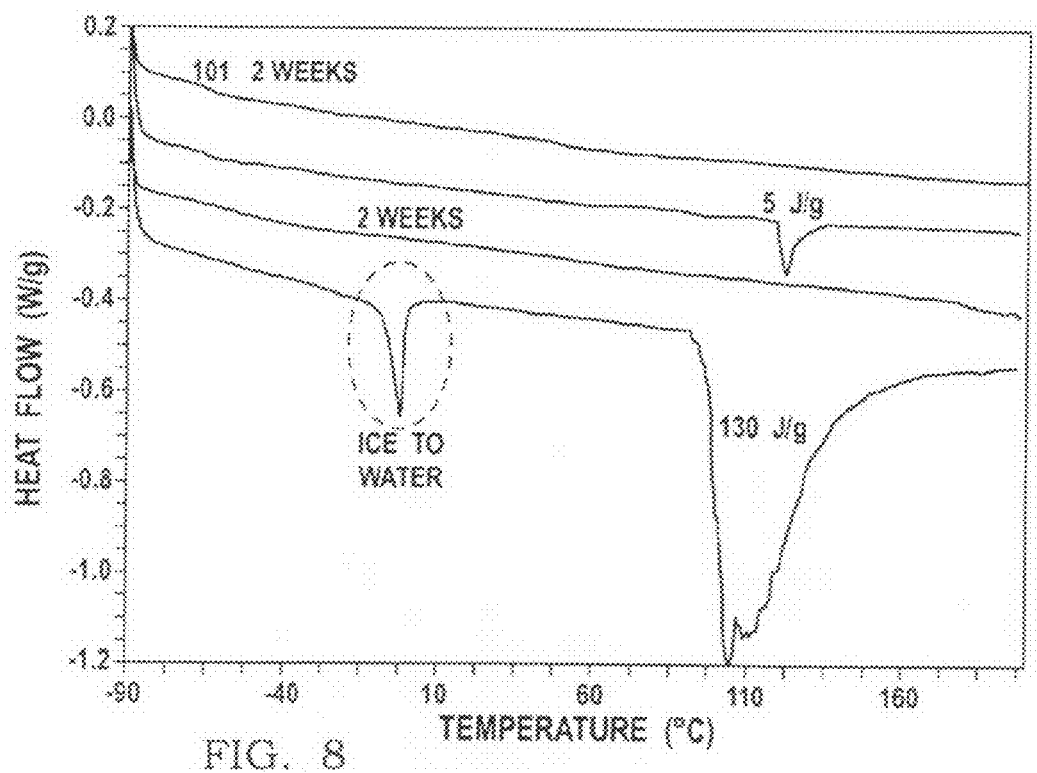
FIG. 8 is a graph illustrating DSC scans for the comparative example as a function of aging time.

FIG. 8 shows the sample DSC scans for the subject sealant composition and the comparative example (day 0 and 2 weeks aged samples). The comparative example 2 weeks aged samples showed ice-to-water transition peak around 0° C. The presence of free water in edge seal may not be acceptable from a mechanical performance point of view. Also, the comparative example tape showed the propensity towards rapid crystallization upon aging (See the peak around 110° C.). This peak corresponds to the crystallized polyethylene (low density and/or linear low density), which is likely the carrier of the silanes. Once these silanes crystallize, they cannot diffuse towards glass and react to build up the chemical adhesion to glass. Thermal analyses of the subject sealant composition silanes did not reveal any significant crystallization upon aging. This non-crystallization tendency was more likely the reason behind the higher lap shears (adhesion to glass) of the subject sealant.

DSC scans for the subject sealant composition and the comparative example (day 0 and 2 weeks aged samples). The comparative example 2 weeks aged samples showed ice-to-water transition peak around 0° C.

The following are examples of the sealant composition of the present invention:

Example 4

| Material | Wt % |
| --- | --- |
| Olefinic polymer | 10 to 60 |
| Silane modified polyolefins | 5 to 30 |
| C black | 2 to 30 |
| Inert fillers | 10 to 60 |
| Water scavenger | 2.5 to 25 |
| Aging Resistors | 0 to 3 |

Example 5

| Material | Wt % |
| --- | --- |
| Olefinic polymer | 20 to 60 |
| Silane modified polyolefins | 5 to 25 |
| C black | 2 to 25 |
| Inert fillers | 20 to 60 |
| Water scavenger | 2.5 to 25 |
| Aging Resistors | 0 to 3 |

Example 6

| Material | Wt % |
| --- | --- |
| Olefinic polymer | 30 to 60 |
| Silane modified polyolefins | 10 to 25 |
| C black | 2 to 25 |
| Inert fillers | 30 to 60 |
| Water scavenger | 5 to 25 |
| Aging resistor | 0 to 2 |

The olefinic polymers may include, for example, polyethylene, polypropylene, polybutene, polyisobutene, butyl rubber (polyisobutene-isoprene), styrene block copolymers, and modified forms of styrene block copolymers. The olefinic polymers have number average molecular weights of 100-700,000 Da, and preferably have number average molecular weights of 100-300,000 Da.

The silanes may include, for example, DFDA-5451NT (silane grafted PE available from Dow Chemical of Midland, Mich.), DFDA-5481 NT (moisture curing catalyst from Dow Chemical of Midland, Mich.), amorphous poly alpha olefins (such as but not restricted to VESTOPLAST 206 and VESTOPLAST 2412 available from Evonik Degussa GmbH of Marl, Germany), alkoxy silanes, and amino silanes.

The inert fillers may include, for example, ground and precipitated chalks, silicates, silicon oxides, C black, CaCO3, Ca(OH)2, and titanium dioxide. The silicates may include, for example, talc, kaolin, mica, silicon oxide, silicas, and calcium or magnesium silicates. The aging resistors may include, for example, hindered phenols, hindered amines, thioethers, mercapto compounds, phosphorous esters, benzotriazoles, benzophenones, and antizonants.

The sealant composition of the present invention exhibits the following characteristics:
a) a tensile strength (the peak value on engineering stress-strain curve) of greater than 20 PSI;
b) a tensile strength (the peak value on engineering stress-strain curve) of greater than 50 PSI;
c) a lap shear strength greater than 20 PSI that fails cohesively;
d) a lap shear strength greater than 40 PSI that fails cohesively;
e) reacts with polar surfaces containing hydroxyl (—OH) groups such as glass and poly(vinyl alcohol) (PVA) and/or alkoxy groups;
f) an endothermic enthalpy for a peak (DSC run at 10 C/min, TA instruments Q 200 equipment) approximately 100-140 C less than 50 J/g upon 4 weeks aging under 85% relative humidity 85° C.;
g) an endothermic enthalpy for a peak (DSC run at 10 C/min, TA instruments Q 200 equipment) approximately 100-140° C. less than 30 J/g upon 4 weeks aging under 85% relative humidity 85° C.;
h) a moisture vapor transmission less than 0.7 $g/m^2$ day at 38° C. and 100% relative humidity for 0.060 to 0.080 inch thick samples;
i) a moisture vapor transmission less than 0.4 $g/m^2$ day at 38° C. and 100% relative humidity for 0.060 to 0.080 inch thick samples;
j) a moisture vapor transmission less than 15 $g/m^2$ day at 85° C. and 100% relative humidity for 0.060 to 0.080 inch thick samples as tested using Mocon Permatron-W® model 3/33;
k) a moisture vapor transmission less than 8 $g/m^2$ day at 85° C. and 100% relative humidity for 0.060 to 0.080 inch thick samples as tested using Mocon Permatron-W® model 3/33;
l) a melt volume index less than 50 $cm^3$/10 min at 130° C. and 10 kg load through 0.0823 inch diameter orifice;
m) a high viscosity under low shear and a lower viscosity under high shear.

The description of the invention is merely exemplary in nature and variations that do not depart from the gist of the invention are intended to be within the scope of the invention. Such variations are not to be regarded as a departure from the spirit and scope of the invention.

The invention claimed is:

1. A sealant composition comprising:
a) an olefinic polymer;
b) a silane modified olefinic polymer;
c) a carbon black having a primary particle size in the range of 50 nm to 60 nm that results in the sealant composition having a volume resistivity of >$10^{10}$ Ohm·cm, wherein the carbon black is oxidatively post-treated by a furnace process and included in an amount of up to 20% by weight of the total sealant composition;
d) at least one of a desiccant and a water scavenger; and
e) an aging resistor; and
wherein a tensile strength and a lap shear strength of the sealant composition is balanced such that the sealant fails cohesively before failing adhesively.

2. The sealant composition of claim 1 wherein the sealant composition has a tensile strength greater than 20 PSI and a lap shear strength greater than 20 PSI.

3. The sealant composition of claim 1 wherein the sealant composition has a tensile strength greater than 50 PSI and a lap shear strength greater than 40 PSI.

4. The sealant composition of claim 1 wherein the sealant composition chemically reacts with a polar surface containing at least one of alkoxy groups and hydroxyl (—OH) groups, wherein the hydroxyl groups are present on the surface of glass or poly(vinyl alcohol) (PVA).

5. The sealant composition of claim 1 wherein the sealant composition has an endothermic enthalpy for a peak of approximately 100-140° C. of less than 50 J/g after four (4) weeks of aging under 85% relative humidity and 85° C.

6. The sealant composition of claim 1 wherein the sealant composition has an endothermic enthalpy for a peak of approximately 100-140° C. of less than 30 J/g, after four (4) weeks of aging under 85% relative humidity and 85° C.

7. The sealant composition of claim 1 wherein the sealant composition has a moisture vapor transmission rate (MVTR) less than 0.7 $g/m^2$/day at 38° C. and 100% relative humidity for a 0.060 to 0.080 inch thick sample of the sealant composition.

8. The sealant composition of claim 1 wherein the sealant composition has a moisture vapor transmission rate (MVTR)

less than 0.4 g/m²/day at 38° C. and 100% relative humidity for a 0.060 to 0.080 inch thick sample of the sealant composition.

9. The sealant composition of claim 1 wherein the sealant composition has a moisture vapor transmission rate (MVTR) less than 15 g/m²/day at 85° C. and 100% relative humidity for a 0.060 to 0.080 inch thick sample of the sealant composition.

10. The sealant composition of claim 1 wherein the sealant composition has a moisture vapor transmission rate (MVTR) less than 8 g/m²/day at 85° C. and 100% relative humidity for a 0.060 to 0.080 inch thick sample of the sealant composition.

11. The sealant composition of claim 1 wherein the sealant composition has a melt volume index (MVI) less than 50 cm³/10 minutes at 130° C. and 10 kg load through a 0.0823 inch diameter orifice.

12. The sealant composition of claim 1 wherein the sealant composition exhibits a first viscosity when a first shear force is applied to the sealant composition and a second viscosity when a second shear force is applied to the sealant composition.

13. The sealant composition of claim 12 wherein the first viscosity of the sealant composition is greater than the second viscosity and the first shear force is less than the second shear force.

14. The sealant composition of claim 1 wherein the olefinic polymers are present in the sealant composition in an amount from about 20% to about 60% by weight of the total sealant composition.

15. The sealant composition of claim 1 wherein the olefinic polymers are present in the sealant composition in an amount from about 30% to about 50% by weight of the total sealant composition.

16. The sealant composition of claim 1 wherein the silane modified olefinic polymer is present in the sealant composition in an amount from about 2% to about 35% by weight of the total sealant composition.

17. The sealant composition of claim 1 wherein the silane modified olefinic polymer is present in the sealant composition in an amount from about 5% to about 25% by weight of the total sealant composition.

18. The sealant composition of claim 1 wherein the carbon black is present in the sealant composition in an amount from about 5% to 20% by weight of the total sealant composition.

19. The sealant composition of claim 1 wherein the at least one of the desiccant and water scavenger is present in the sealant composition in an amount from about 2.5% to about 25% by weight of the total sealant composition.

20. The sealant composition of claim 1 wherein the at least one of the desiccant and water scavenger is present in the sealant composition in an amount from about 10% to about 15% by weight of the total sealant composition.

21. The sealant composition of claim 1 wherein the aging resistor is present in the sealant composition in an amount up to about 3% by weight of the total sealant composition.

22. A solar module comprising:
a first substrate having a hydroxyl group;
a second substrate having at least one of a hydroxyl group and an alkoxy group;
at least one photovoltaic cell disposed between the first and second substrates; and
a sealant in contact with the first and second substrates to form a moisture vapor barrier to hinder moisture vapor from reaching the at least one photovoltaic cell, wherein the sealant includes:
a) an olefinic polymer;
b) a silane modified olefinic polymer;
c) a carbon black having a primary particle size in the range of 50 nm to 60 nm that results in the sealant composition having a volume resistivity of $>10^{10}$ Ohm·cm, wherein the carbon black is oxidatively post-treated by a furnace process and included in an amount of up to 20% by weight of the total sealant composition;
d) at least one of a desiccant and a water scavenger; and
e) an aging resistor;
wherein a tensile strength and a lap shear strength of the sealant is balanced such that the sealant fails cohesively before failing adhesively and wherein the sealant has a tensile strength greater than 20 PSI and a lap shear strength greater than 20 PSI.

23. The solar module of claim 22 wherein the sealant chemically reacts with the hydroxyl group present on the polar surface of the first substrate and at least one of the alkoxy groups and the hydroxyl (—OH) groups present on the polar surface of the second substrate.

24. The solar module of claim 22 wherein the sealant has an endothermic enthalpy for a peak of approximately 100-140° C. of less than 50 J/g after four (4) weeks of aging under 85% relative humidity and 85° C.

25. The solar module of claim 22 wherein the sealant has an endothermic enthalpy for a peak of approximately 100-140° C. of less than 30 J/g after four (4) weeks of aging under 85% relative humidity and 85° C.

26. The solar module of claim 22 wherein the sealant has a moisture vapor transmission rate (MVTR) less than 0.7 g/m²/day at 38° C. and 100% relative humidity for a 0.060 to 0.080 inch thick sample.

27. The solar module of claim 22 wherein the sealant has a moisture vapor transmission rate (MVTR) less than 0.4 g/m²/day, at 38° C. and 100% relative humidity for a 0.060 to 0.080 inch thick sample.

28. The solar module of claim 22 wherein the sealant has a moisture vapor transmission rate (MVTR) less than 15 g/m²/day at 85° C. and 100% relative humidity for a 0.060 to 0.080 inch thick sample.

29. The solar module of claim 22 wherein the sealant has a moisture vapor transmission rate (MVTR) less than 8 g/m²/day, at 85° C. and 100% relative humidity for a 0.060 to 0.080 inch thick sample.

30. The solar module of claim 22 wherein the sealant has a melt volume index (MVI) less than 50 cm³/10 minutes at 130° C. and 10 kg load through a 0.0823 inch diameter orifice.

31. The solar module of claim 22 wherein the sealant exhibits a first viscosity when a first shear force is applied to the sealant and a second viscosity when a second shear force is applied to the sealant.

32. The solar module of claim 31 wherein the first viscosity of the sealant is greater than the second viscosity and the first shear force is less than the second shear force.

33. The solar module of claim 22 wherein the olefinic polymer of the sealant is present in an amount from about 30% to about 60% by weight of the sealant, the modified olefinic polymer is present in an amount from about 2% to about 35% by weight of the sealant, the at least one of the desiccant and water scavenger is present in an amount from about 2.5% to about 25% by weight of the sealant, the aging resistor is present in an amount from about 0% to about 3% by weight of the sealant.

34. The solar module of claim 22 wherein the olefinic polymer of the sealant is present in an amount from about 30% to about 50% by weight of the sealant, the modified olefinic polymer is present in an amount from about 5% to about 25% by weight of the sealant, the at least one of the desiccant and water scavenger is present in an amount from about 10% to about 15% by weight of the sealant, the aging resistor is present in an amount from about 0% to about 3% by weight of the sealant.

35. A sealant composition comprising:
  a) an olefinic polymer;
  b) a silane modified olefinic polymer; wherein the silane modified olefinic polymer includes a reactive group that chemically reacts with a polar surface including at least one of alkoxy groups and hydroxyl (—OH) groups to form a bond that is greater than the cohesive strength of the sealant composition;
  c) a carbon black having a primary particle size in the range of 50 nm to 60 nm that results in the sealant composition having a volume resistivity of >$10^{10}$ Ohm·cm, wherein the carbon black is oxidatively post-treated by a furnace process and included in an amount of up to 20% by weight of the total sealant composition;
  d) at least one of a desiccant and a water scavenger; and
  e) an aging resistor, and
  wherein the sealant composition has a tensile strength greater than 20 PSI and a lap shear strength greater than 20 PSI.

36. The sealant composition of claim 35 wherein the tensile strength of the sealant composition is greater than 50 PSI.

37. The sealant composition of claim 35 wherein the lap shear strength of the sealant composition is greater than 40 PSI.

38. The sealant composition of claim 35 wherein the sealant composition has an endothermic enthalpy for a peak of approximately 100-140° C. of less than 50 J/g after four (4) weeks of aging under 85% relative humidity and 85° C.

39. The sealant composition of claim 35 wherein the sealant composition has an endothermic enthalpy for a peak of approximately 100-140° C. of less than 30 J/g after four (4) weeks of aging under 85% relative humidity and 85° C.

40. The sealant composition of claim 35 wherein the sealant composition has a moisture vapor transmission rate (MVTR) less than 0.7 g/m²/day at 38° C. and 100% relative humidity for a 0.060 to 0.080 inch thick sample.

41. The sealant composition of claim 35 wherein the sealant composition has a moisture vapor transmission rate (MVTR) less than 0.4 g/m²/day at 38° C. and 100% relative humidity for a 0.060 to 0.080 inch thick sample.

42. The sealant composition of claim 35 wherein the sealant composition has a moisture vapor transmission rate (MVTR) less than 15 g/m²/day at 85° C. and 100% relative humidity for a 0.060 to 0.080 inch thick sample.

43. The sealant composition of claim 35 the sealant composition has a moisture vapor transmission rate (MVTR) less than 8 g/m²/day at 85° C. and 100% relative humidity for a 0.060 to 0.080 inch thick sample.

44. The sealant composition of claim 35 wherein the sealant composition has a melt volume index (MVI) less than 50 cm³/10 minutes at 130° C. and 10 kg load through 0.0823 inch diameter orifice.

45. The sealant composition of claim 35 wherein the sealant composition exhibits a first viscosity when a first shear force is applied to the sealant composition and a second viscosity when a second shear force is applied to the composition.

46. The sealant composition of claim 45 wherein the first viscosity of the sealant composition is greater than the second viscosity and the first shear force is less than the second shear force.

47. The sealant composition of claim 35 wherein the olefinic polymer of the sealant composition is present in an amount from about 30% to 60% by weight of the total sealant composition, the modified olefinic polymer is present in an amount from about 2% to about 35% by weight of the total sealant composition, the at least one of the desiccant and water scavenger is present in an amount from about 2.5% to about 25% by weight of the total sealant composition, the aging resistor is present in an amount from about 0% to about 3% by weight of the total sealant composition.

48. The sealant composition of claim 35 wherein the olefinic polymer of the sealant composition is present in an amount from about 30% to about 50% by weight of the total sealant composition, the modified olefinic polymer is present in an amount from about 5% to about 25% by weight of the total sealant composition, the at least one of the desiccant and water scavenger is present in an amount from about 10% to about 15% by weight of the total sealant composition, the aging resistor is present in an amount from about 0% to about 3% by weight of the total sealant composition.

49. A sealant disposed between a first substrate and a second substrate, the sealant configured to inhibit the transmission of moisture to a moisture sensitive material disposed between the first and second substrates, the sealant comprising:
  an olefinic polymer;
  at least one of a silane modified APAO and a silane modified polyisobutylene;
  a carbon black having a primary particle size in the range of 50 nm to 60 nm that results in the sealant composition having a volume resistivity of >$10^{10}$ Ohm·cm, wherein the carbon black is oxidatively post-treated by a furnace process and included in an amount of up to 20% by weight of the total sealant composition;
  a filler including a calcium carbonate or a silicate;
  at least one of a water scavenger and a desiccant; and
  an aging resistor;
  wherein the at least one of the silane modified APAO and the silane modified polyisobutylene includes a reactive group that chemically bonds with the reactive group of the first and second substrates to form a bond that is greater than the cohesive strength of the sealant.

50. The sealant of claim 49 wherein the olefinic polymer includes a polyisobutylene in an amount from about 30% to about 60% by weight of the total sealant composition, the at least one of the silane modified APAO and the silane modified polyisobutylene is included in an amount from about 2% to about 35% by weight of the total sealant composition, the at least one of the water scavenger and the desiccant is included in an amount from about 2.5% to about 25% by weight of the total sealant composition, and the aging resistor is included in an amount from 0.1% to about 3% by weight of the total sealant composition.

51. The sealant of claim 49 wherein the olefinic polymer includes a polyisobutylene in an amount from about 30% to about 50% by weight of the total sealant composition.

52. The sealant of claim 49 wherein the at least one of the silane modified APAO and the silane modified polyisobutylene is included in an amount from about 5% to about 25% by weight of the total sealant composition.

53. The sealant of claim 49 wherein the sealant is oxidatively stable after 4000 hrs. of exposure to temperatures greater than 110° C.

54. The sealant of claim 49 wherein the aging resistor includes a phenol antioxidant.

* * * * *